United States Patent
Chang et al.

(10) Patent No.: US 9,722,584 B1
(45) Date of Patent: Aug. 1, 2017

(54) NON-VOLATILE LATCH

(71) Applicant: National Tsing Hua University, Hsinchu (TW)

(72) Inventors: Meng-Fan Chang, Taichung (TW); Albert Lee, Hsinchu (TW); Chieh-Pu Lo, Hsinchu (TW); Chien-Chen Lin, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 15/134,046

(22) Filed: Apr. 20, 2016

(51) Int. Cl.
G11C 7/10 (2006.01)
H03K 3/356 (2006.01)
H03K 3/037 (2006.01)
G11C 13/00 (2006.01)

(52) U.S. Cl.
CPC ... *H03K 3/356008* (2013.01); *G11C 13/0069* (2013.01); *H03K 3/0375* (2013.01)

(58) Field of Classification Search
CPC .......... H03K 3/356008; H03K 3/0375; H03K 13/0069
USPC ..................................... 365/189.05
See application file for complete search history.

(56) References Cited

U.S. PATENT DOCUMENTS

| | | | |
|---|---|---|---|
| 7,733,145 B2 * | 6/2010 | Abe ........................ | G11C 11/16 327/218 |
| 7,961,502 B2 * | 6/2011 | Chua-Eoan ........... | G11C 11/005 365/158 |
| 8,405,421 B2 * | 3/2013 | Shukh .................... | H03K 19/16 326/121 |
| 8,437,177 B2 | 5/2013 | Katoh | |
| 8,619,466 B2 * | 12/2013 | Katoh ................. | G11C 11/4125 365/148 |
| 8,670,266 B2 | 3/2014 | Jung et al. | |

(Continued)

FOREIGN PATENT DOCUMENTS

| CN | 103051307 | 4/2013 |
|---|---|---|
| TW | I319883 | 1/2010 |

OTHER PUBLICATIONS

Meng-Fan Chang, et al., "Embedded 1Mb ReRAM in 28nm CMOS with 0.27-to-1V Read Using Swing-Sample-and-Couple Sense Amplifier and Self-Boost-Write-Termination Scheme," 2014 IEEE International Solid-State Circuits Conference, Session 19 / Non-volatile Memory Solutions / 19.4, Feb. 12, 2014, pp. 331-333.

(Continued)

*Primary Examiner* — Viet Q Nguyen
(74) *Attorney, Agent, or Firm* — J.C. Patents

(57) ABSTRACT

Provided is a non-volatile latch, which includes a latch circuit, a first switch circuit, a non-volatile memory device, a second switch circuit and a third switch circuit. A first terminal of the first switch circuit is coupled to a first output terminal of the latch circuit. The first switch circuit is turned off in a normal operation period. A first terminal of the non-volatile memory device is coupled to a second terminal of the first switch circuit. A second terminal of the non-volatile memory device is coupled to a programming voltage via the second switch circuit. In a store period, according to latched data of the latch circuit and a state transformation condition of the non-volatile memory device, the third switch circuit can dynamically determine whether to couple the first terminal of the non-volatile memory device to a reference voltage.

14 Claims, 10 Drawing Sheets

(56) References Cited

U.S. PATENT DOCUMENTS

| | | | | |
|---|---|---|---|---|
| 8,792,268 | B2* | 7/2014 | Katoh | H03K 3/0375 |
| | | | | 365/148 |
| 8,942,027 | B1* | 1/2015 | Chuang | G11C 14/009 |
| | | | | 365/148 |
| 9,147,454 | B2* | 9/2015 | Sun | G11C 11/1673 |
| 9,196,337 | B2* | 11/2015 | Jung | G11C 11/1673 |
| 2011/0273925 | A1* | 11/2011 | Yamamoto | G11C 14/0081 |
| | | | | 365/154 |
| 2013/0308373 | A1* | 11/2013 | Shukh | G11C 11/16 |
| | | | | 365/158 |

OTHER PUBLICATIONS

Chul-Moon Jung, et al., "Zero-Sleep-Leakage Flip-Flop Circuit With Conditional-Storing Memristor Retention Latch," IEEE Transactions on Nanotechnology, vol. 11, No. 2, Mar. 2012, pp. 360-366.

Yongpan Liu, et al., "A 65nm ReRAM-Enabled Nonvolatile Processor with 6× Reduction in Restore Time and 4× Higher Clock Frequency Using Adaptive Data Retention and Self-Write-Termination Nonvolatile Logic," 2016 IEEE International Solid-State Circuits Conference, Session 4 / Digital Processors / 4.7, Feb. 1, 2016, pp. 83-85.

* cited by examiner

NON-VOLATILE LATCH

BACKGROUND OF THE INVENTION

Field of the Invention

The invention relates to a latch, and more particularly, to a non-volatile latch.

Description of Related Art

Latches are frequently used in electronic circuits. However, the conventional latch belongs to a volatile memory device. When the system enters a suspend mode, it is often that the power of the conventional latch cannot be turned off in order to keep the data. Once the power of the conventional latch is turned off, the data latched at the conventional latch will disappear.

SUMMARY OF THE INVENTION

The invention is directed to a non-volatile latch. In the normal operation mode, operations of the non-volatile latch have the characteristics of common latches. After turning off the power of the non-volatile latch, the non-volatile latch can keep the original data.

A non-volatile latch is provided according to embodiments of the invention. The non-volatile latch includes a latch circuit, a first switch circuit, a first non-volatile memory device, a second switch circuit and a third switch circuit. The latch circuit has a first output terminal. A first terminal of the first switch circuit is coupled to a first output terminal of the latch circuit. The first switch circuit is turned off in a normal operation period. A first terminal of the first non-volatile memory device is coupled to a second terminal of the first switch circuit. A first terminal of the second switch circuit is coupled to a second terminal of the first non-volatile memory device. A second terminal of the second switch circuit is coupled to a programming voltage. A first terminal of the third switch circuit is coupled to the first terminal of the first non-volatile memory device. In a store period, according to latched data of the latch circuit and a state transformation condition of the first non-volatile memory device, the third switch circuit can dynamically determine whether to couple the first terminal of the first non-volatile memory device to a reference voltage.

Based on the above, the non-volatile latch provided in the embodiments of the invention can include characteristics of common latches in the normal operation mode. In the store period before turning off the power of the latch, the non-volatile latch can store the latched data of the latch circuit into the non-volatile latch. As a result, after turning off the power of the non-volatile latch, the non-volatile latch can keep the original data.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
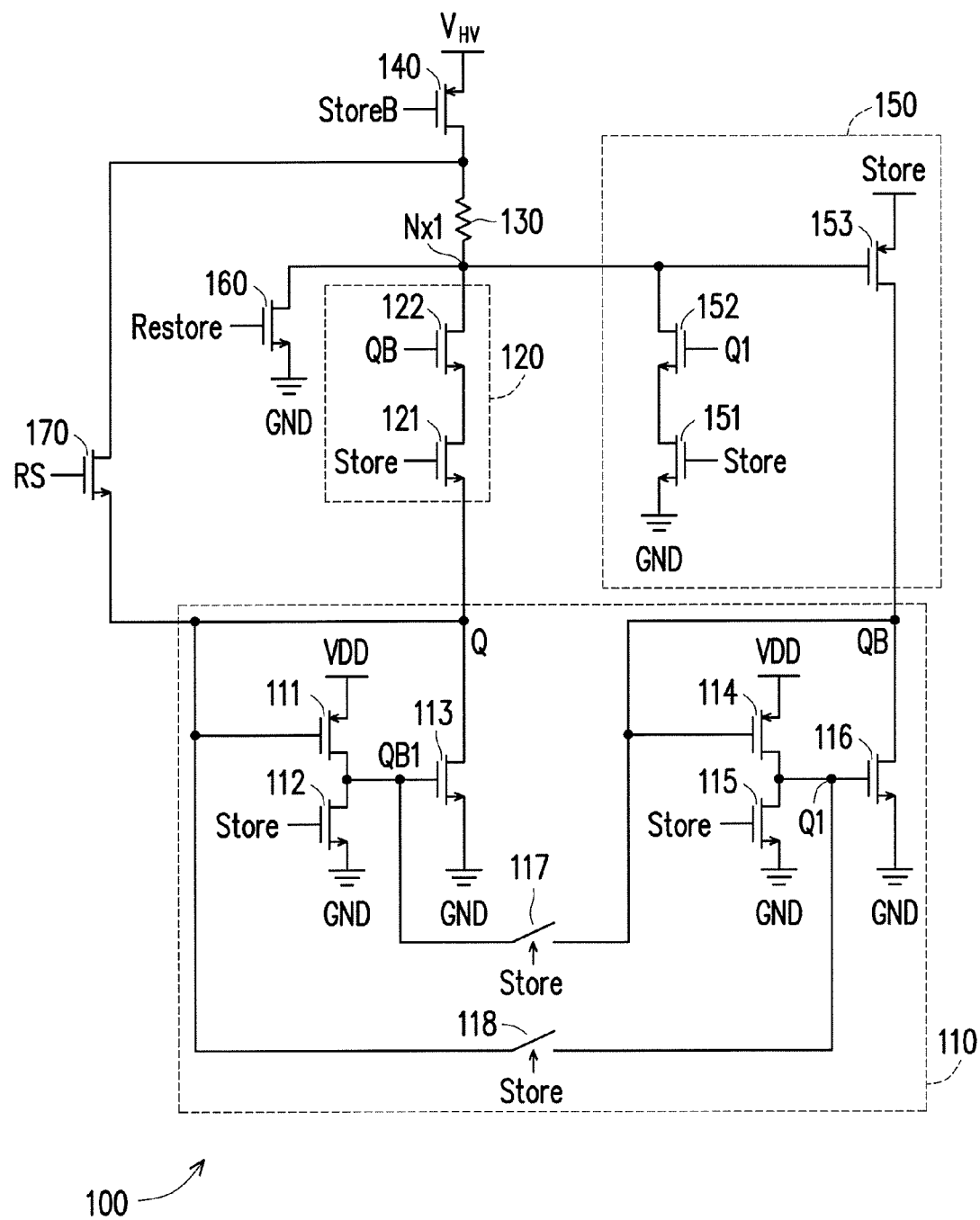
FIG. 1A is a block diagram illustrating circuitry of a non-volatile latch according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

The term "coupled (or connected)" used in this specification (including claims) may refer to any direct or indirect connection means. For example, "a first device is coupled (connected) to a second device" should be interpreted as "the first device is directly connected to the second device" or "the first device is indirectly connected to the second device through other devices or connection means". Moreover, wherever appropriate in the drawings and embodiments, elements/components/steps with the same reference numerals represent the same or similar parts. Elements/components/steps with the same reference numerals or names in different embodiments may be cross-referenced.

FIG. 1A is a block diagram illustrating circuitry of a non-volatile latch 100 according to an embodiment of the invention. The non-volatile latch 100 includes a latch circuit 110, a first switch circuit 120, a first non-volatile memory device 130, a second switch circuit 140 and a third switch circuit 150. The first non-volatile memory device 130 may adopt different implementations based on different design requirements. For instance, the first non-volatile memory device 130 may be a conventional resistive memory. As another example, the first non-volatile memory device 130 includes a resistive memory. The resistive memory may include a top electrode TE, a variable resistor and a bottom electrode BE, wherein the resistive memory may be disposed between the top electrode TE and the bottom electrode BE. A material of the bottom electrode BE may be a $YBa_2Cu_3O_7$ (YBCO) layer, or titanium nitride (TiN), or oxides, nitrides, oxynitrides of an element selected from Mn, Fe, Ni, Co, Ti, Cu, V and Si, or a combination of the above (e.g., Ti, $SiO_2$, Si, etc.). A material of the variable resistor may be a $Pr1-XCaXMnO_3$ (PCMO) film of a pervoskite oxide, or a ZnSe—Ge heterogeneous structure, or a metal-oxide related to Ti, Nb, Hf, Zr, Ta, Ni, V, Zn, Sn, In, Th and Al (e.g., a $HfO_2$ thin film). A material of the top electrode TE may be an Ag film deposited by sputtering, or TiN. With changes made in the materials and/or processing conditions of the top electrode TE, the variable resistor and the bottom electrode BE, a resistance and a clamp voltage of the first non-volatile memory device 130 may become different accordingly. A resistance state of the first non-volatile memory device 130 may be changed by adjusting a voltage difference between the top electrode TE and the bottom electrode BE of the first non-volatile memory device 130.

Figure 2:
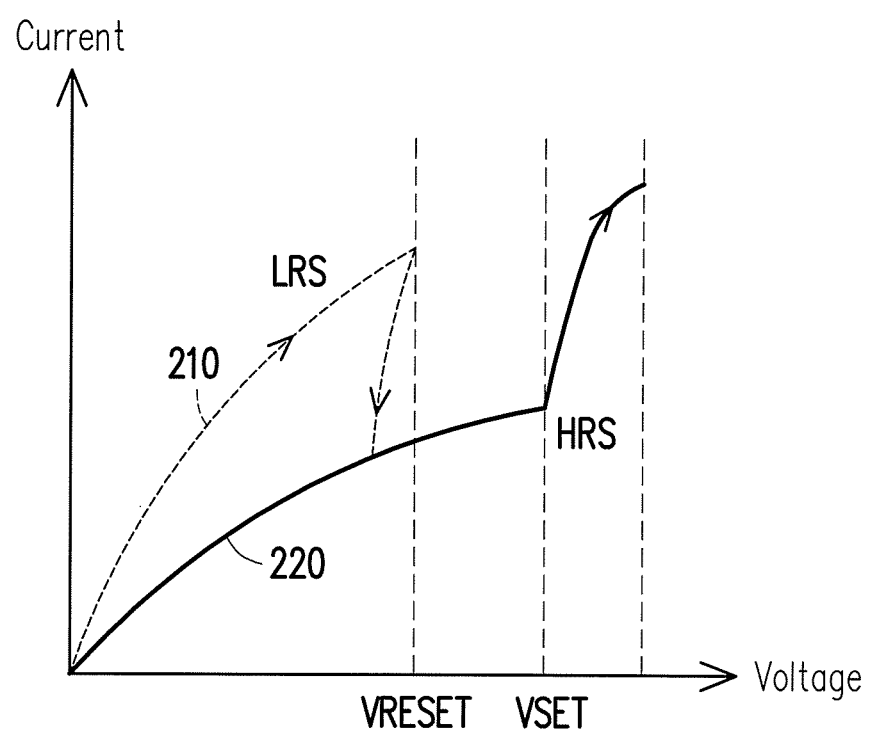
FIG. 2 is a schematic diagram illustrating a characteristic curve of the first non-volatile memory device depicted in FIG. 1.

For instance, FIG. 2 is a schematic diagram illustrating a characteristic curve of the first non-volatile memory device 130 depicted in FIG. 1A. In FIG. 2, a horizontal axis represents the voltage difference between the top electrode TE and the bottom electrode BE of the first non-volatile memory device 130, and a vertical axis represents a value of a current flowed through the first non-volatile memory device 130. A curve 210 represents a current-versus-voltage characteristic curve of the first non-volatile memory device 130 in a low resistance state LRS. Based on different materials, a resistance of the low resistance state LRS may be tens or hundreds Ohm (e.g., several KΩ). When the voltage difference between the top electrode TE and the bottom electrode BE of the first non-volatile memory device 130 is greater than a first clamp voltage (i.e., a reset voltage VRESET depicted in FIG. 2), the first non-volatile memory device 130 starts a "reset" operation to transform the resistance state of the first non-volatile memory device 130 from the low resistance state LRS into a high resistance state HRS. A curve 220 represents a current-versus-voltage characteristic curve of the first non-volatile memory device 130 in the high resistance state HRS. Based on different materials, a resistance of the high resistance state HRS may be more than dozens times the resistance of the low resistance state LRS (e.g., 10K to 100MΩ). When the voltage difference between the top electrode TE and the bottom electrode BE of the first non-volatile memory device 130 is greater than a second clamp voltage (i.e., a set voltage VSET depicted in FIG. 2), the first non-volatile memory device 130 starts a "set" operation to transform the resistance state of the first non-volatile memory device 130 from the high resistance state HRS into the low resistance state LRS.

Referring to FIG. 1A, the latch circuit 110 has a first output terminal Q and a second output terminal QB. A first terminal of the first switch circuit 120 is coupled to the first output terminal Q of the latch circuit 110. The first switch circuit 120 is turned off in a normal operation period NOP. The first switch circuit 120 is turned on in a store period STP. A first terminal (e.g., the bottom electrode) of the first non-volatile memory device 130 is coupled to a second terminal of the first switch circuit 120. A first terminal of the second switch circuit 140 is coupled to a second terminal (e.g., the top electrode) of the first non-volatile memory device 130. A second terminal of the second switch circuit 140 is coupled to a programming voltage $V_{HV}$. A voltage level of the programming voltage $V_{HV}$ may be determined according to design requirements. For example, the programming voltage $V_{HV}$ may be any voltage level greater than the set voltage VSET depicted in FIG. 2. The second switch circuit 140 is controlled by a store control signal StoreB, so as to determine whether to transmit the programming voltage $V_{HV}$ to the second terminal of the first non-volatile memory device 130. In the embodiment depicted in FIG. 1A, the second switch circuit 140 includes a P-type Metal Oxide Semiconductor (PMOS) transistor, which has a first terminal (e.g., the source) coupled to the programming voltage $V_{HV}$, and a second terminal (e.g., the drain) coupled to the second terminal of the first non-volatile memory device 130.

A first terminal of the third switch circuit 150 is coupled to the first terminal of the first non-volatile memory device 130. In the store period STP, according to latched data of the latch circuit 110 and a state transformation condition of the first non-volatile memory device 130, the third switch circuit 150 can dynamically determine whether to couple the first terminal of the first non-volatile memory device 130 to a reference voltage (e.g., a ground voltage GND). For instance, if the latched data of the latch circuit 110 is logic 1 (i.e., the first output terminal Q of the latch circuit 110 outputs logic 1), the third switch circuit 150 can couple the first terminal of the first non-volatile memory device 130 to the ground voltage GND, so that the voltage difference between the two terminals of the first non-volatile memory device 130 is approximately the programming voltage $V_{HV}$ (i.e., greater than the set voltage VSET depicted in FIG. 2). Because the voltage difference between the two terminals of the first non-volatile memory device 130 is greater than the set voltage VSET depicted in FIG. 2, the resistance state of the first non-volatile memory device 130 is transformed from the low resistance state LRS into the high resistance state HRS. When the resistance state of the first non-volatile memory device 130 is transformed into the high resistance state FIRS, the third switch circuit 150 can dynamically disconnect the first terminal of the first non-volatile memory device 130 from the ground voltage GND, so as to reduce power consumption.

In the present embodiment, the latch circuit 110 depicted in FIG. 1A includes a transistor 111, a transistor 112, a transistor 113, a transistor 114, a transistor 115, a transistor 116, a first switch 117 and a second switch 118. In the present embodiment, the transistor 111 and the transistor 114 are the PMOS transistors, whereas the transistor 112, the transistor 113, the transistor 115 and the transistor 116 are N-type Metal Oxide Semiconductor (NMOS) transistors. A first terminal (e.g., the source) of the transistor 111 is coupled to a system voltage VDD. A control terminal (e.g., the gate) of the transistor 111 is coupled to the first output terminal Q of the latch circuit 110. A first terminal (e.g., the source) of the transistor 112 is coupled to the reference voltage (e.g., the ground voltage GND). A second terminal (e.g., the drain) of the transistor 112 is coupled to a second terminal (e.g., the drain) of the transistor 111. A first terminal (e.g., the source) of the transistor 113 is coupled to the reference voltage (e.g., the ground voltage GND). A second terminal (e.g., the drain) of the transistor 113 is coupled to the first output terminal Q of the latch circuit 110. A control terminal (e.g., the gate) of the transistor 113 is coupled to the second terminal of the transistor 111.

A first terminal (e.g., the source) of the transistor 114 is coupled to the system voltage VDD. A control terminal (e.g., the gate) of the transistor 114 is coupled to the second output terminal QB of the latch circuit 110. A first terminal (e.g., the source) of the transistor 115 is coupled to the reference voltage (e.g., the ground voltage GND). A second terminal (e.g., the drain) of the transistor 115 is coupled to a second terminal (e.g., the drain) of the transistor 114. A first ten final (e.g., the source) of the transistor 116 is coupled to the reference voltage (e.g., the ground voltage GND). A second terminal (e.g., the drain) of the transistor 116 is coupled to the second output terminal QB of the latch circuit 110. A control terminal (e.g., the gate) of the transistor 116 is coupled to the second terminal of the transistor 114.

A first terminal of the first switch 117 is coupled to the second terminal of the transistor 111. A second terminal of the first switch 117 is coupled to the control terminal of the transistor 114 and the second terminal of the transistor 116. A first terminal of the second switch 118 is coupled to the control terminal of the transistor 111 and the second terminal of the transistor 113. A second terminal of the second switch 118 is coupled to the second terminal of the transistor 114. The first switch 117, the second switch 118, the transistor 112 and the transistor 115 are controlled by a store control signal Store. The first switch 117 and the second switch 118 are turned on in the normal operation period NOP. The transistor 112 and the transistor 115 are turned off when the first switch 117 and the second switch 118 are turned on. Accordingly, in the normal operation period NOP, the transistor 111 and the transistor 116 form one first inverter, and the transistor 113 and the transistor 114 form one second inverter. The first inverter and the second inverter constitute one latch. The first switch 117 and the second switch 118 are turned off in the store period STP. The transistor 112 and the transistor 115 are turned on when the first switch 117 and the second switch 118 are turned off.

In the present embodiment, the first switch circuit 120 depicted in FIG. 1A includes a transistor 121 and a transistor 122. In the present embodiment, the transistor 121 and the transistor 122 are the NMOS transistors. A first terminal (e.g., the source) of the transistor 121 is coupled to the first output terminal Q of the latch circuit 110. The transistor 121 is controlled by the store control signal Store. The transistor 121 is turned on in the store period STP. The transistor 121 is turned off in the normal operation period NOP. A first terminal (e.g., the source) of the transistor 122 is coupled to a second terminal (e.g., the drain) of the transistor 121. A second terminal (e.g., the drain) of the transistor 122 is coupled to the first terminal of the first non-volatile memory device 130. A control terminal (e.g., the gate) of the transistor 122 is coupled to the second output terminal QB of the latch circuit 110.

In the embodiment depicted in FIG. 1A, the third switch circuit 150 includes a transistor 151, a transistor 152 and a transistor 153. In the present embodiment, the transistor 151 and the transistor 152 are the NMOS transistors, and the transistor 153 is the PMOS transistor. A first terminal (e.g., the source) of the transistor 151 is coupled to the reference voltage (e.g., the ground voltage GND). The transistor 151 is controlled by the store control signal Store. The transistor 151 is turned on in the store period STP. The transistor 151 is turned off in the normal operation period NOP. A first terminal (e.g., the source) of the transistor 152 is coupled to a second terminal (e.g., the drain) of the transistor 151. A second terminal (e.g., the drain) of the transistor 152 is coupled to the first terminal of the first non-volatile memory device 130. A control terminal (e.g., the gate) of the transistor 152 is coupled to the second terminal of the transistor 114 of the latch circuit 110 to receive a gate voltage Q1 of the transistor 116 of the latch circuit 110. A first terminal (e.g., the source) of the transistor 153 is coupled to the store control signal Store. A second terminal (e.g., the drain) of the transistor 153 is coupled to the second output terminal QB of the latch circuit 110. A control terminal (e.g., the gate) of the transistor 153 is coupled to the first terminal of the first non-volatile memory device 130.

In the embodiment depicted in FIG. 1A, the non-volatile latch 100 further includes a transistor 160 and a transistor 170. In the present embodiment, the transistor 160 and the transistor 170 are the NMOS transistors. A first terminal (e.g., the source) of the transistor 160 is coupled to the reference voltage (e.g., the ground voltage GND). A second terminal (e.g., the drain) of the transistor 160 is coupled to the first terminal of the first non-volatile memory device 130. The transistor 160 is controlled by a restore control signal Restore. The transistor 160 is turned on in a restore period RSTP. The transistor 160 is turned off in the normal operation period NOP and the store period STP. A first terminal (e.g., the source) of the transistor 170 is coupled to the first output terminal Q of the latch circuit 110. A second terminal (e.g., the drain) of the transistor 170 is coupled to the second terminal of the first non-volatile memory device 130. The transistor 170 is controlled by a control signal RS. The transistor 170 is turned on in the store period STP and the restore period RSTP. The transistor 170 is turned off in the normal operation period NOP.

TABLE 1

Truth table of the non-volatile latch 100 depicted in FIG. 1A

| Signal | NOP | STP | | RSTP |
| | | Reset | Set | |
| --- | --- | --- | --- | --- |
| RS | 0 | VDD | VDD | VDD |
| Store | 0 | VDD | VDD | 0 |
| Restore | 0 | 0 | 0 | VDD |
| StoreB | 0 | 0 | 0 | 0 |
| $V_{HV}$ | (>VDD) | (>VSET) | (>VSET) | VDD (<VRESET) |

Table 1 illustrates the truth table of the control signal RS, the store control signal Store, the restore control signal Restore, the store control signal StoreB and the programming voltage $V_{HV}$ in the non-volatile latch 100 depicted in FIG. 1A. In the normal operation period NOP, the control signal RS, the store control signal Store, the restore control signal Restore and the store control signal StoreB are all logic 0, and the programming voltage $V_{HV}$ may be greater than the system voltage VDD. Accordingly, the transistors 112, 115, 121, 151, 153, 160 and 170 are turned off, and the transistor 111, the transistor 113, the transistor 114 and the transistor 116 of the latch circuit 110 form one latch.

In the store period STP, the non-volatile latch 100 can perform a reset stage Reset and a set stage Set in order to store the latched data of the latch circuit 110 (i.e., output data of the first output terminal Q of the latch circuit 110) into the first non-volatile memory device 130. In the store period STP, the control signal RS and the store control signal Store are both logic 1 (where the voltage level is, for example, the system voltage VDD), the restore control signal Restore and the store control signal StoreB are both logic 0, and the programming voltage $V_{HV}$ may be greater than the set voltage VSET depicted in FIG. 2. Accordingly, the transistors 112, 115, 121, 151 and 170 are turned on, and the transistor 160 and the switches 117 and 118 are turned off.

Figure 1B:
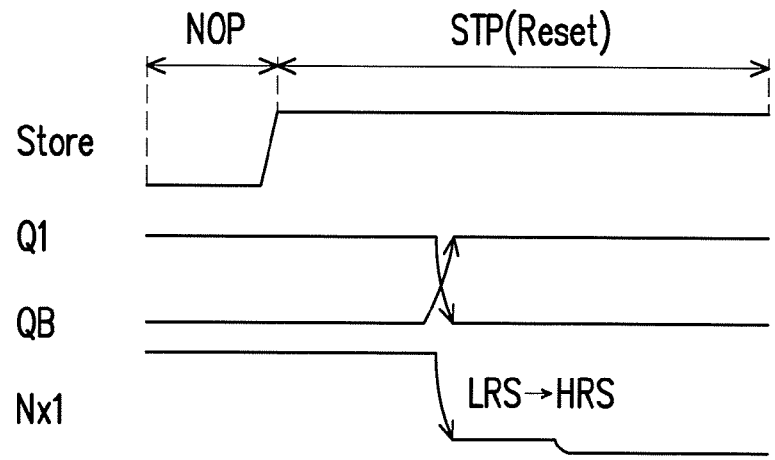
FIG. 1B is a schematic diagram illustrating a timing sequence of the control signal depicted in FIG. 1A according to an embodiment of the present disclosure.

FIG. 1B is a schematic diagram illustrating a timing sequence of the control signal depicted in FIG. 1A according to an embodiment of the present disclosure. Assuming that the output data of the first output terminal Q of the latch circuit 110 is logic 1 (i.e., the output data of the second output terminal QB is logic 0), a gate voltage Q1 of the transistor 116 of the latch circuit 110 shall be logic 1 so that the first terminal of the first non-volatile memory device 130 (i.e. the node Nx1) is coupled to the ground voltage GND via the transistors 152 and 151. Accordingly, the first non-volatile memory device 130 starts the "reset" operation in the store period STP if the resistance state of the first non-volatile memory device 130 is the low resistance state LRS in the normal operation period NOP, so that the resistance state of the first non-volatile memory device 130 is transformed from the low resistance state LRS into the high resistance state HRS. When the resistance state of the first non-volatile memory device 130 is transformed from the low resistance state LRS into the high resistance state HRS, the gate voltage of the transistor 153 (i.e. the voltage of the node Nx1) is transformed from high potential into low potential so that potential of QB is transformed from low potential (logic 0) into high potential (logic 1). The transformation in potential of QB transforms the gate voltage Q1 of the transistor 116 from high potential (logic 1) into low potential (logic 0) to thereby latch the second output terminal QB at logic 1. Because the gate voltage Q1 is transformed into low potential, the transistor 152 is turned off to disconnect the first terminal of the first non-volatile memory device 130 from the ground voltage GND. Accordingly, in the reset stage Reset, the non-volatile latch 100 may store the latched data of the latch circuit 110 into the first non-volatile memory device 130 (the high resistance state HRS is considered as logic 1 in this example). When the resistance state of the first non-volatile memory device 130 is transformed into the high resistance state HRS, the third switch circuit 150 can dynamically disconnect the first terminal of the first non-volatile memory device 130 from the ground voltage GND, so as to reduce power consumption. In other words, the non-volatile latch 100 can self-terminate the "reset" operation.

Figure 1C:
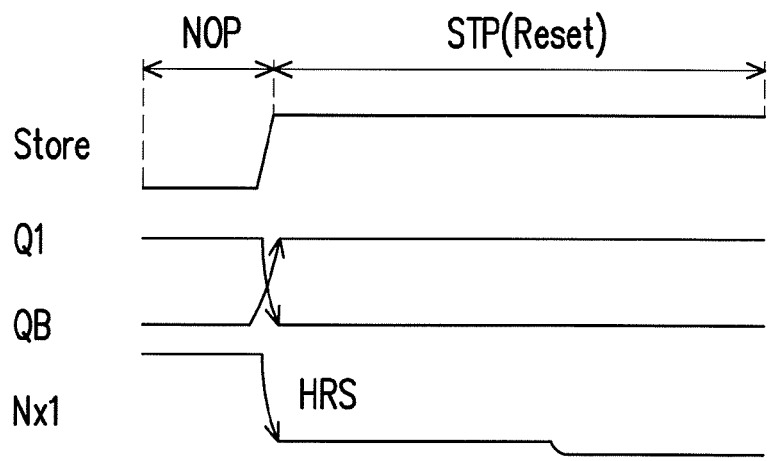
FIG. 1C is a schematic diagram illustrating a timing sequence of the control signal depicted in FIG. 1A according to another embodiment of the present disclosure.

FIG. 1C is a schematic diagram illustrating a timing sequence of the control signal depicted in FIG. 1A according to another embodiment of the present disclosure. Assuming that the output data of the first output terminal Q of the latch circuit 110 is logic 1 (i.e., the output data of the second output terminal QB is logic 0), but the resistance state of the first non-volatile memory device 130 is the high resistance state HRS in the normal operation period NOP. The gate voltage Q1 of the transistor 116 of the latch circuit 110 is logic 1 so that the first terminal of the first non-volatile memory device 130 (i.e. the node Nx1) is coupled to the ground voltage GND via the transistors 152 and 151. The gate voltage of the transistor 153 (i.e. the voltage of the node Nx1) is low potential because the resistance state of the first non-volatile memory device 130 is the high resistance state HRS, so that potential of QB is high potential (logic 1) in the store period STP. The gate voltage Q1 of the transistor 116 is low potential (logic 0) to thereby latch the second output terminal QB at logic 1. Because the gate voltage Q1 is low potential, the transistor 152 is turned off in real time to disconnect the first terminal of the first non-volatile memory device 130 from the ground voltage GND. Accordingly, no operation happening on the first non-volatile memory device 130 (the high resistance state HRS is considered as logic 1 in this example). The third switch circuit 150 can dynamically disconnect the first terminal of the first non-volatile memory device 130 from the ground voltage GND, so as to reduce power consumption. In other words, the non-volatile latch 100 can self-terminate the "reset" operation.

Figure 1D:
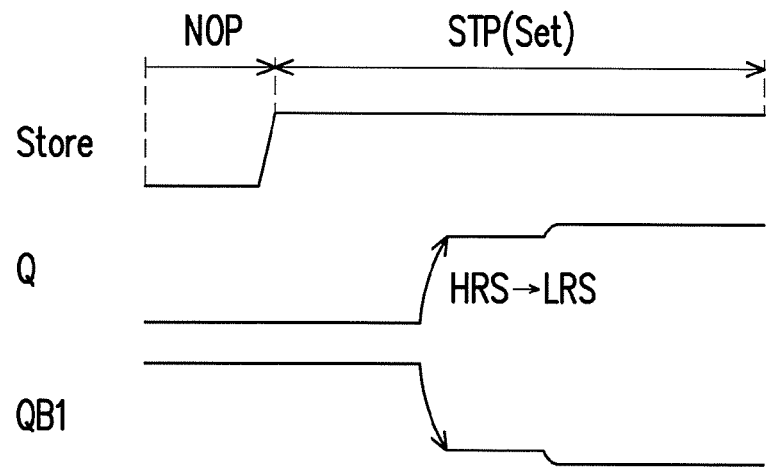
FIG. 1D is a schematic diagram illustrating a timing sequence of the control signal depicted in FIG. 1A according to another embodiment of the present disclosure.

FIG. 1D is a schematic diagram illustrating a timing sequence of the control signal depicted in FIG. 1A according to another embodiment of the present disclosure. In the store period STP, assuming that the output data of the first output terminal Q of the latch circuit 110 is logic 0 (i.e., the output data of the second output terminal QB is logic 1), a gate voltage Q1 of the transistor 116 of the latch circuit 110 shall be logic 0 so that the transistor 152 is turned off. The transistor 122 is turned on so that the first terminal of the first non-volatile memory device 130 (i.e. the node Nx1) is coupled to the ground voltage GND via the transistors 122, 121 and 113. Because a size of the transistor 170 is very small (the channel width is very small), a capability of the transistor 170 is far smaller than a capability of the transistor 113. When the transistor 113 is turned on, the transistor 170 will not affect the output data of the first output terminal Q of the latch circuit 110. Accordingly, the first non-volatile memory device 130 starts the "set" operation in the store period STP if the resistance state of the first non-volatile memory device 130 is the high resistance state HRS in the normal operation period NOP, so that the resistance state of the first non-volatile memory device 130 is transformed from the high resistance state HRS into the low resistance state LRS. When the resistance state of the first non-volatile memory device 130 is transformed from the high resistance state HRS into the low resistance state LRS, potential of Q is transformed from low potential (logic 0) into high potential (logic 1). The transformation in potential of Q transforms the gate voltage QB1 of the transistor 113 from high potential (logic 1) into low potential (logic 0) to thereby latch the first output terminal Q at logic 1. Because the gate voltage QB1 of the transistor 113 is transformed into low potential, the transistor 113 is turned off to disconnect the first terminal of the first non-volatile memory device 130 from the ground voltage GND. Accordingly, in the set stage Set, the non-volatile latch 100 may store the latched data of the latch circuit 110 into the first non-volatile memory device 130 (the low resistance state LRS is considered as logic 0 in this example). When the resistance state of the first non-volatile memory device 130 is transformed into the low resistance state LRS, the transistor 113 can dynamically disconnect the first terminal of the first non-volatile memory device 130 from the ground voltage GND, so as to reduce power consumption. In other words, the non-volatile latch 100 can self-terminate the "set" operation. After the store period STP is completed, the power (the system voltage VDD) of the non-volatile latch 100 may be turned off, while the original data of the latch circuit 110 is kept by the first non-volatile memory device 130.

Figure 1E:
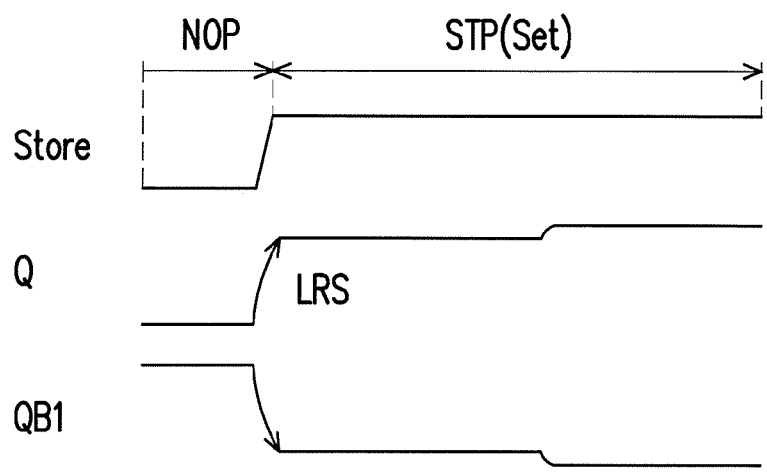
FIG. 1E is a schematic diagram illustrating a timing sequence of the control signal depicted in FIG. 1A according to another embodiment of the present disclosure.

FIG. 1E is a schematic diagram illustrating a timing sequence of the control signal depicted in FIG. 1A according to another embodiment of the present disclosure. Assuming that the output data of the first output terminal Q of the latch circuit 110 is logic 0 (i.e., the output data of the second output terminal QB is logic 1), but the resistance state of the first non-volatile memory device 130 is the low resistance state LRS in the normal operation period NOP. The first terminal of the first non-volatile memory device 130 (i.e. the node Nx1) is coupled to the ground voltage GND via the transistors 122, 121 and 113. The potential of Q is transformed from low potential (logic 0) into high potential (logic 1) by the first non-volatile memory device 130 because the resistance state of the first non-volatile memory device 130 is the low resistance state LRS. The transformation in potential of Q transforms the gate voltage QB1 of the transistor 113 from high potential (logic 1) into low potential (logic 0) to thereby latch the first output terminal Q at logic 1. Because the gate voltage QB1 of the transistor 113 is transformed into low potential, the transistor 113 is turned off in real time to disconnect the first terminal of the first non-volatile memory device 130 from the ground voltage GND. Accordingly, no operation happening on the first non-volatile memory device 130 (the low resistance state LRS is considered as logic 0 in this example). The transistor 113 can dynamically disconnect the first terminal of the first non-volatile memory device 130 from the ground voltage GND, so as to reduce power consumption. In other words, the non-volatile latch 100 can self-terminate the "set" operation. After the store period STP is completed, the power (the system voltage VDD) of the non-volatile latch 100 may be turned off, while the original data of the latch circuit 110 is kept by the first non-volatile memory device 130.

After the power is restored (supply of the system voltage VDD is restored) back to the latch circuit 110, the non-volatile latch 100 first enters the restore period RSTP. In the restore period RSTP, the control signal RS and the restore control signal Restore are both logic 1 (where the voltage level is, for example, the system voltage VDD), the store control signal Store and the store control signal StoreB are both logic 0, and the programming voltage $V_{HV}$ may be set as the system voltage VDD (which is less than the reset voltage VRESET depicted in FIG. 2). Accordingly, the transistors 160 and 170 and the switches 117 and 118 are turned on, and the transistors 112, 115, 121 and 151 are turned off. Assuming that the resistance state of the first non-volatile memory device 130 is the low resistance state LRS (the low resistance state LRS is considered as logic 0 in this example), a voltage of the first output terminal Q of the latch circuit 110 is pulled down to low potential (logic 0) by transistor 160 and the first non-volatile memory device 130. Accordingly, after supply of the system voltage VDD is restored back to the latch circuit 110, logic 0 of the first non-volatile memory device 130 may be restored back to the latch circuit 110.

In the restore period RSTP, assuming that the resistance state of the first non-volatile memory device 130 is the high resistance state HRS (the high resistance state HRS is considered as logic 1 in this example), the voltage of the first output terminal Q of the latch circuit 110 is pulled up to high potential (logic 1) by transistor 140. Accordingly, after supply of the system voltage VDD is restored back to the latch circuit 110, logic 1 of the first non-volatile memory device 130 may be restored back to the latch circuit 110.

Figure 3A:
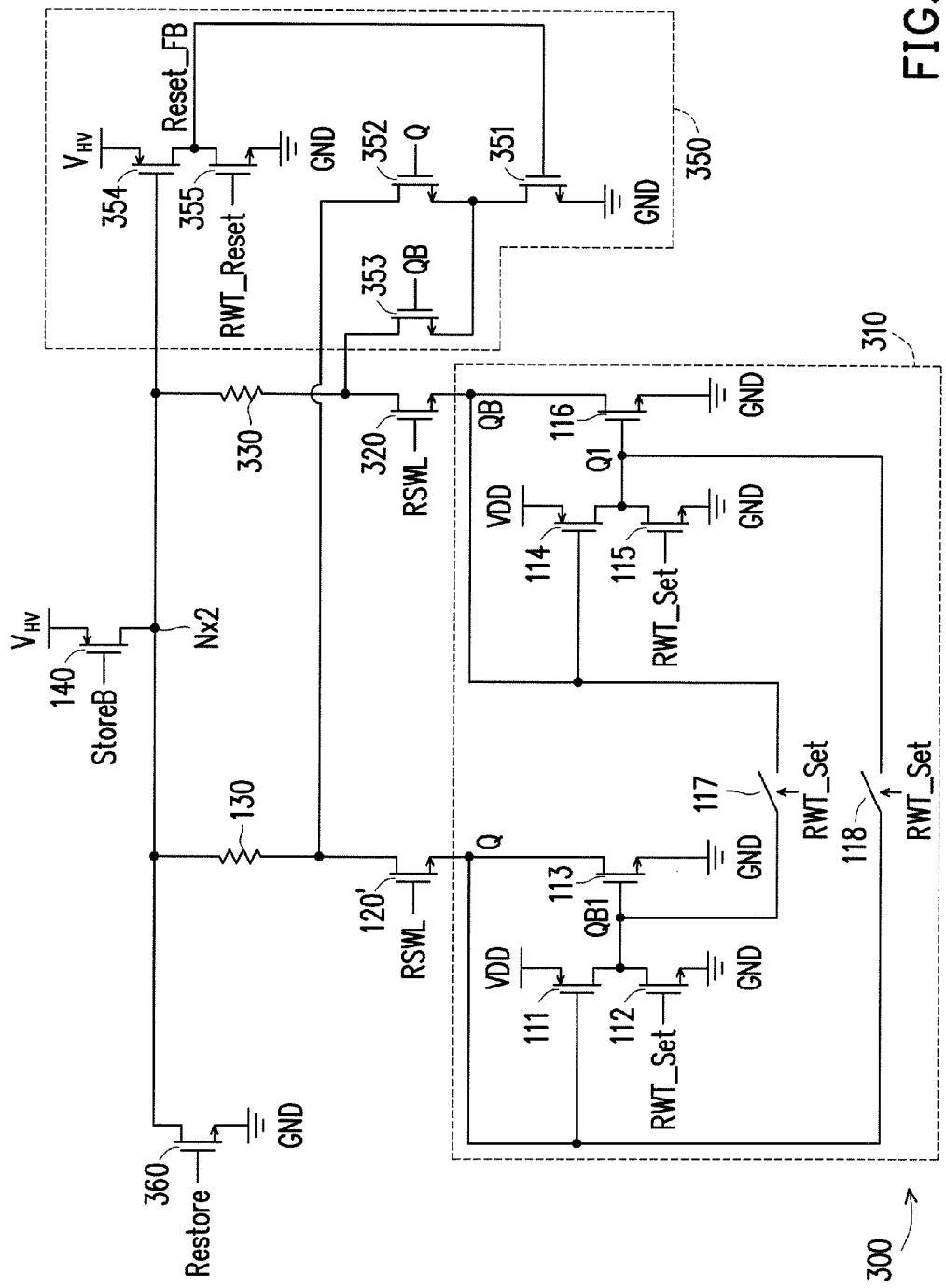
FIG. 3A is a block diagram illustrating circuitry of a non-volatile latch according to another embodiment of the invention.

FIG. 3A is a block diagram illustrating circuitry of a non-volatile latch 300 according to another embodiment of the invention. The non-volatile latch 300 includes a latch circuit 310, a first switch circuit 120', a first non-volatile memory device 130, a second switch circuit 140 and a third switch circuit 350. The latch circuit 310, the first switch circuit 120', the first non-volatile memory device 130, the second switch circuit 140 and the third switch circuit 350 depicted in FIG. 3A may refer to related description for the latch circuit 110, the first switch circuit 120, the first non-volatile memory device 130, the second switch circuit 140 and the third switch circuit 150 depicted in FIG. 1A and FIG. 2. In the embodiment depicted in FIG. 3A, the non-volatile latch 300 further includes a fourth switch circuit 320, a second non-volatile memory device 330 and a transistor 360. The second non-volatile memory device 330 may refer related description for the first non-volatile memory device 130, which is not repeated hereinafter.

In the embodiment depicted in FIG. 3A, a transistor 112, a transistor 115, a first switch 117 and a second switch 118 are controlled by a store control signal RWT_Set. In a normal operation period NOP, the first switch 117 and the second switch 118 are turned on, and the transistor 112 and the transistor 115 are turned off. In a reset stage Reset of a store period STP, the first switch 117 and the second switch 118 are turned on, and the transistor 112 and the transistor 115 are turned off. In a set stage Set of the store period STP, the first switch 117 and the second switch 118 are turned off, and the transistor 112 and the transistor 115 are turned on. In a restore period RSTP, the first switch 117 and the second switch 118 are turned on, and the transistor 112 and the transistor 115 are turned off.

A first terminal of the fourth switch circuit 320 is coupled to a second output terminal QB of the latch circuit 310. In the embodiment depicted in FIG. 3A, the fourth switch circuit 320 includes a NMOS transistor, which has a first terminal (e.g., the source) coupled to the second output terminal QB of the latch circuit 310, and a second terminal (e.g., the drain) coupled to a first terminal of the second non-volatile memory device 330. The first switch circuit 120' includes a NMOS transistor, which has a first terminal (e.g., the source) coupled to a first output terminal Q of the latch circuit 310, and a second terminal (e.g., the drain) coupled to a first terminal of the first non-volatile memory device 130. The first switch circuit 120' and the fourth switch circuit 320 are controlled by a store control signal RSWL. The first switch circuit 120' and the fourth switch circuit 320 are turned off in the normal operation period NOP. The first switch circuit 120' and the fourth switch circuit 320 are turned off in the reset stage Reset of the store period STP. The first switch circuit 120' and the fourth switch circuit 320 are turned on in the set stage Set of the store period STP. The first switch circuit 120' and the fourth switch circuit 320 are turned on in the restore period RSTP.

The first terminal of the second non-volatile memory device 330 is coupled to the second terminal of the fourth switch circuit 320. A second terminal of the second non-volatile memory device 330 is coupled to the first terminal of the second switch circuit 140. Herein, a second terminal of the third switch circuit 350 is coupled to the first terminal of the second non-volatile memory device 330. In the store period STP, according to latched data of the latch circuit 310 and a state transformation condition of the first non-volatile memory device 130, the third switch circuit 350 can dynamically determine whether to couple the first terminal of the first non-volatile memory device 130 to a reference voltage (e.g., a ground voltage GND). Alternatively, according to the latched data of the latch circuit 310 and a state transformation condition of the second non-volatile memory device 330, the third switch circuit 350 can dynamically determine whether to couple the first terminal of the second non-volatile memory device 330 to the reference voltage (e.g., the ground voltage GND).

For instance, if the latched data of the latch circuit 310 is logic 1 (i.e., the first output terminal Q of the latch circuit 110 outputs logic 1), the third switch circuit 350 can couple the first terminal of the first non-volatile memory device 130 to the ground voltage GND, so that the first non-volatile memory device 130 can start the "reset" operation. When the resistance state of the first non-volatile memory device 130 is transformed into the high resistance state HRS, the third switch circuit 350 can dynamically disconnect the first terminal of the first non-volatile memory device 130 from the ground voltage GND, so as to reduce power consumption. If the latched data of the latch circuit 310 is logic 0 (i.e., the second output terminal QB of the latch circuit 110 outputs logic 1), the third switch circuit 350 can couple the first terminal of the second non-volatile memory device 330 to the ground voltage GND, so that the second non-volatile memory device 330 can start the "reset" operation. When the resistance state of the second non-volatile memory device 330 is transformed into the high resistance state HRS, the third switch circuit 350 can dynamically disconnect the first terminal of the second non-volatile memory device 330 from the ground voltage GND, so as to reduce power consumption.

In the embodiment depicted in FIG. 3A, the third switch circuit 350 includes a transistor 351, a transistor 352, a transistor 353, a transistor 354 and a transistor 355. In the present embodiment, the transistor 351, the transistor 352, the transistor 353 and the transistor 355 are the NMOS transistors, and the transistor 354 is the PMOS transistor. A first terminal (e.g., the source) of the transistor 351 is coupled to the reference voltage (e.g., the ground voltage GND). A first terminal (e.g., the source) of the transistor 352 is coupled to a second terminal (e.g., the drain) of the transistor 351. A second terminal (e.g., the drain) of the second switch circuit 352 is coupled to the first terminal of the first non-volatile memory device 130. A control terminal (e.g., the gate) of the transistor 352 is coupled to the first output terminal Q of the latch circuit 310. A first terminal (e.g., the source) of the transistor 353 is coupled to the second terminal of the transistor 351. A second terminal (e.g., the drain) of the third switch circuit 353 is coupled to the first terminal of the second non-volatile memory device 330. A control terminal (e.g., the gate) of the transistor 353 is coupled to the second output terminal QB of the latch circuit 310.

A first terminal (e.g., the source) of the transistor 354 is coupled to the programming voltage $V_{HV}$. A second terminal (e.g., the drain) of the transistor 354 is coupled to a control terminal (e.g., the gate) of the transistor 351. A control terminal (e.g., the gate) of the fourth switch circuit 354 is coupled to the second terminal of the first non-volatile memory device 130 and the second terminal of the second non-volatile memory device 330. A first terminal (e.g., the source) of the transistor 355 is coupled to the reference voltage (e.g., the ground voltage GND). A second terminal (e.g., the drain) of the transistor 355 is coupled to the second terminal of the transistor 354. The transistor 355 is controlled by a control signal RWT_Reset. The transistor 355 is turned off in the normal operation period NOP. The transistor 355 is turned on in the store period STP and the restore period RSTP.

A first terminal (e.g., the source) of the transistor 360 is coupled to the reference voltage (e.g., the ground voltage GND). A second terminal (e.g., the drain) of the first switch circuit 360 is coupled to the second terminal of the first non-volatile memory device 130 and the second terminal of the second non-volatile memory device 330. The transistor 360 is controlled by a restore control signal Restore. The transistor 360 is turned on in the normal operation period NOP and the restore period RSTP. The transistor 360 is turned off in the store period STP.

TABLE 2

Truth table of the non-volatile latch 300 depicted in FIG. 3A

| Signal | NOP | STP Reset | STP Set | RSTP |
|---|---|---|---|---|
| RSWL | 0 | 0 | VDD | VDD |
| RWT_Set | 0 | 0 | VDD | 0 |
| StoreB | $V_{HV}$ | 0 | 0 | $V_{HV}$ |
| Restore | VDD | 0 | 0 | VDD |
| RWT_Reset | 0 | High bias | VDD | VDD |

Table 2 illustrates the truth table of the store control signal RSWL, the store control signal RWT_Set, the store control signal StoreB, the restore control signal Restore and the control signal RWT_Reset in the non-volatile latch 300 depicted in FIG. 3A. The programming voltage $V_{HV}$ depicted in FIG. 2 and FIG. 3A may be any voltage level designed to be greater than the set voltage VSET depicted in FIG. 2 according to design requirements. In the normal operation period NOP, the store control signal RSWL, the store control signal RWT_Set and the control signal RWT_Reset are all logic 0, a voltage level of the store control signal StoreB is $V_{HV}$, and a voltage level of the restore control signal Restore is the system voltage VDD. Accordingly, the first switch circuit 120', the second switch circuit 140 and the fourth switch circuit 320 are turned off, the transistors 112, 115 and 355 are turned off, the first switch 117 and the second switch 118 are turned on, and the transistor 360 is turned on. Accordingly, the transistor 111, the transistor 113, the transistor 114 and the transistor 116 of the latch circuit 310 form one latch.

In the store period STP, the non-volatile latch 300 can perform the reset stage Reset and the set stage Set in order to store the latched data of the latch circuit 310 (i.e., the output data of the output terminals Q and QB) into the first non-volatile latch 130 and the second non-volatile memory device 330. In the reset stage Reset, the store control signal RSWL, the store control signal RWT_Set, the store control signal StoreB and the restore control signal Restore are all logic 0, and a voltage level of the control signal RWT_Reset is at high bias level. Accordingly, the first switch circuit 120' and the fourth switch circuit 320 are turned off, the transistors 112 and 115 are turned off, the first switch 117 and the second switch 118 are turned on, the second switch circuit 140 is turned on, the transistor 360 is turned off, and the transistor 355 is turned on.

Figure 3B:
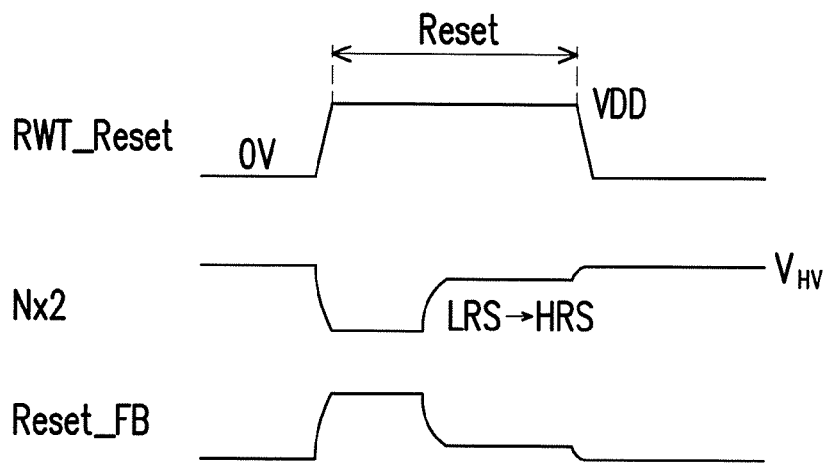
FIG. 3B is a schematic diagram illustrating a timing sequence of the control signal depicted in FIG. 3A according to an embodiment of the present disclosure.

FIG. 3B is a schematic diagram illustrating a timing sequence of the control signal depicted in FIG. 3A according to an embodiment of the present disclosure. Assuming that the output data of the first output terminal Q of the latch circuit 310 is logic 1 (i.e., the output data of the second output terminal QB is logic 0), the transistor 352 is turned on, and the transistor 353 is turned off. The first terminal of the first non-volatile memory device 130 is coupled to the ground voltage GND via the transistors 352 and 351. Accordingly, the first non-volatile memory device 130 starts the "reset" operation, so that the resistance state of the first non-volatile memory device 130 is transformed from the low resistance state LRS into the high resistance state HRS. When the resistance state of the first non-volatile memory device 130 is transformed from the high resistance state HRS into the low resistance state LRS, the gate voltage of the transistor 354 (i.e. the voltage of the node Nx2) is transformed from low potential into high potential and the gate voltage Reset_FB of the transistor 351 is transformed from high potential into low potential, so that the transistor 351 is turned off to disconnect the first terminal of the first non-volatile memory device 130 from the ground voltage GND. Accordingly, in the reset stage Reset, the non-volatile latch 300 may store logic 1 of the first terminal Q of the latch circuit 310 into the first non-volatile memory device 130 (the high resistance state HRS is considered as logic 1 in this example). When the resistance state of the first non-volatile memory device 130 is transformed into the high resistance state HRS, the third switch circuit 350 can dynamically disconnect the first terminal of the first non-volatile memory device 130 from the ground voltage GND, so as to reduce power consumption. In other words, the non-volatile latch 300 can self-terminate the "reset" operation.

Figure 3C:
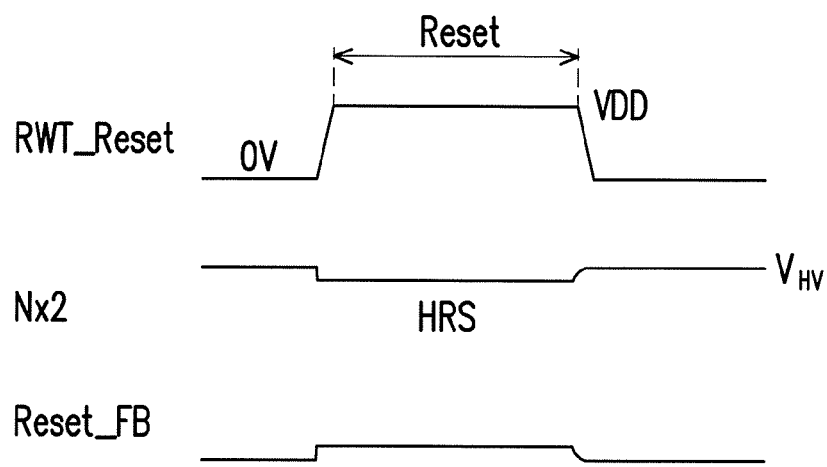
FIG. 3C is a schematic diagram illustrating a timing sequence of the control signal depicted in FIG. 3A according to another embodiment of the present disclosure.

FIG. 3C is a schematic diagram illustrating a timing sequence of the control signal depicted in FIG. 3A according to another embodiment of the present disclosure. Assuming that the output data of the first output terminal Q of the latch circuit 110 is logic 1 (i.e., the output data of the second output terminal QB is logic 0), but the resistance state of the first non-volatile memory device 130 is the high resistance state HRS in the normal operation period NOP. The first output terminal Q of the latch circuit 310 is logic 1 so that the first terminal of the first non-volatile memory device 130 is coupled to the ground voltage GND via the transistors 352 and 351. The voltage of the node Nx2 is high potential because the resistance state of the first non-volatile memory device 130 is the high resistance state HRS, so that the transistors 354 and 351 are turned off in the reset stage Reset of the store period STP. Accordingly, no operation happening on the first non-volatile memory device 130 (the high resistance state HRS is considered as logic 1 in this example). When the transistor 351 is turned off, the third switch circuit 350 can dynamically disconnect the first terminal of the first non-volatile memory device 130 from the ground voltage GND, so as to reduce power consumption.

In the set stage Set of the store period STP, all of the voltage levels of the store control signal RSWL, the store control signal RWT_Set and the control signal RWT_Reset are the system voltage VDD, and the store control signal StoreB and the restore control signal Restore are both logic 0. Accordingly, the first switch circuit 120' and the fourth switch circuit 320 are turned on, the transistors 112 and 115 are turned on, the first switch 117 and the second switch 118 are turned off, the second switch circuit 140 is turned on, the transistor 360 is turned off, and the transistor 355 is turned on.

Figure 3D:
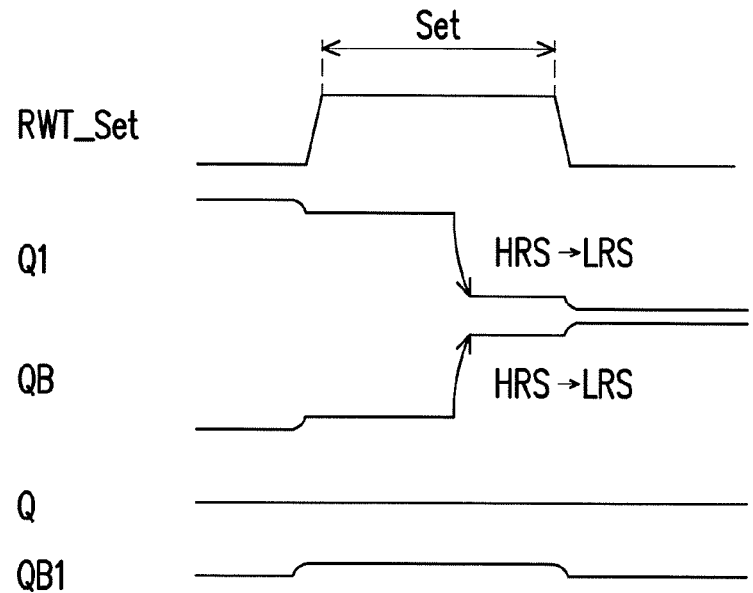
FIG. 3D is a schematic diagram illustrating a timing sequence of the control signal depicted in FIG. 3A according to another embodiment of the present disclosure.

FIG. 3D is a schematic diagram illustrating a timing sequence of the control signal depicted in FIG. 3A according to another embodiment of the present disclosure. Assuming that the output data of the first output terminal Q of the latch circuit 310 is logic 1 (i.e., the output data of the second output terminal QB is logic 0), so that the transistor 111 is turned off, and the gate voltage QB1 of the transistor 113 is pulled down by the transistor 112, and the transistor 113 is turned off. The resistance state of the first non-volatile memory device 130 does not change because the first terminal of the first non-volatile memory device 130 is disconnected from the ground voltage GND. The first terminal of the second non-volatile memory device 330 is coupled to the ground voltage GND via the fourth switch circuit 320 and the transistor 116. Accordingly, the second non-volatile memory device 330 starts the "set" operation, so that the resistance state of the second non-volatile memory device 330 is transformed from the high resistance state HRS into the low resistance state LRS. When the resistance state of the second non-volatile memory device 330 is transformed from the high resistance state HRS into the low resistance state LRS, potential of the second output terminal QB is transformed from low potential (logic 0) into high potential (logic 1), so that the transistor 114 is turned off. The gate voltage Q1 of the transistor 116 is pulled down by the transistor 115, so that the transistor 116 is turned off to disconnect the first terminal of the second non-volatile memory device 330 from the ground voltage GND. Accordingly, in the set stage Set, the non-volatile latch 300 may store the latched data of the latch circuit 310 into the second non-volatile memory device 330 (the low resistance state LRS is considered as logic 0 in this example). When the resistance state of the second non-volatile memory device 330 is transformed into the low resistance state LRS, the transistor 116 can dynamically disconnect the first terminal of the second non-volatile memory device 330 from the ground voltage GND, so as to reduce power consumption.

Figure 3E:
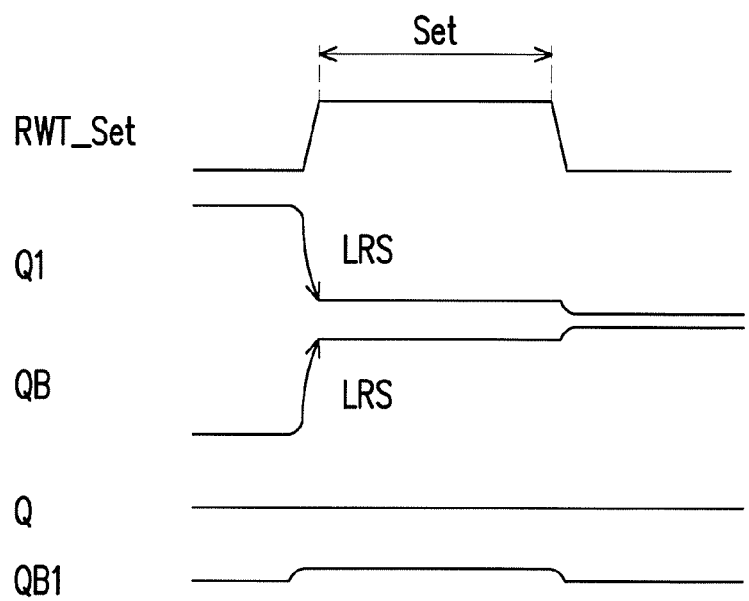
FIG. 3E is a schematic diagram illustrating a timing sequence of the control signal depicted in FIG. 3A according to another embodiment of the present disclosure.

FIG. 3E is a schematic diagram illustrating a timing sequence of the control signal depicted in FIG. 3A according to another embodiment of the present disclosure. Assuming that the output data of the first output terminal Q of the latch circuit 110 is logic 1 (i.e., the output data of the second output terminal QB is logic 0), but the resistance state of the second non-volatile memory device 330 is the low resistance state LRS in the normal operation period NOP. The second output terminal QB of the latch circuit 310 is pulled to high potential by the second non-volatile memory device 330 in the set stage Set of the store period STP because the resistance state of the second non-volatile memory device 330 is the low resistance state LRS. The transistor 114 is turned off, and the gate voltage Q1 of the transistor 116 is pulled down by the transistor 115, so that the transistor 116 is turned off to disconnect the first terminal of the second non-volatile memory device 330 from the ground voltage GND in the set stage Set of the store period STP. Accordingly, no operation happening on the second non-volatile memory device 330 (the low resistance state LRS is considered as logic 0 in this example). When the transistor 116 is turned off, the transistor 116 can dynamically disconnect the first terminal of the second non-volatile memory device 330 from the ground voltage GND, so as to reduce power consumption.

In other words, the non-volatile latch 300 can self-terminate the "set" operation. After the store period STP is completed, the power (the system voltage VDD) of the non-volatile latch 300 may be turned off, while the original data of the latch circuit 310 is kept by the first non-volatile memory device 130 and the second non-volatile memory device 330.

After the power is restored (supply of the system voltage VDD is restored) back to the latch circuit 310, the non-volatile latch 300 first enters the restore period RSTP. In the restore period RSTP, all of the voltage levels of the store control signal RSWL, the restore control signal Restore and the control signal RWT_Reset are the system voltage VDD, the store control signal RWT_Set is logic 0, and the store control signal StoreB is the programming voltage $V_{HV}$. Accordingly, the first switch circuit 120' and the fourth switch circuit 320 are turned on, the transistors 112 and 115 are turned off, the first switch 117 and the second switch 118 are turned on, the second switch circuit 140 is turned off, the transistor 360 is turned on, and the transistor 355 is turned on.

Figure 3F:
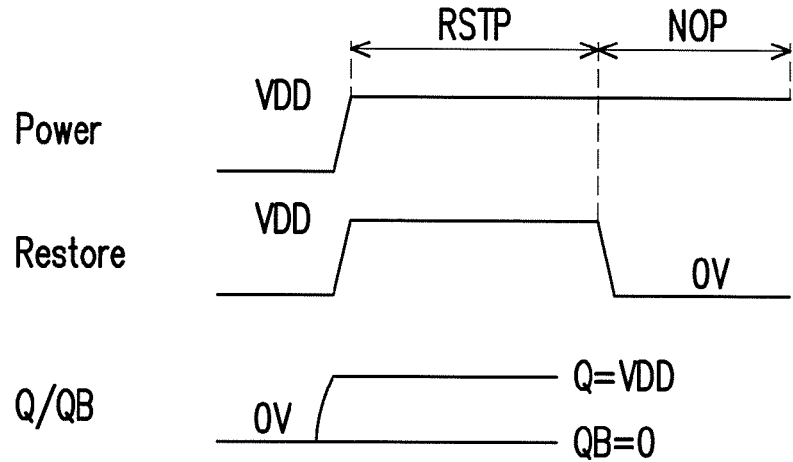
FIG. 3F is a schematic diagram illustrating a timing sequence of the control signal depicted in FIG. 3A according to another embodiment of the present disclosure.

FIG. 3F is a schematic diagram illustrating a timing sequence of the control signal depicted in FIG. 3A according to another embodiment of the present disclosure. Assuming that the resistance state of the first non-volatile memory device 130 is the high resistance state HRS (the high resistance state HRS is considered as logic 1 in this example) and the resistance state of the second non-volatile memory device 330 is the low resistance state LRS (the low resistance state LRS is considered as logic 0 in this example), a voltage difference is present between the voltage of first output terminal Q and the voltage of second output terminal QB (the voltage of second output terminal QB is lower than the voltage of first output terminal Q). Such voltage difference will be pulled up by the latch circuit 310, such that the first output terminal Q of the latch circuit 310 is pulled up to high potential (logic 1) and the second output terminal QB of the latch circuit 310 is pulled down to low potential (logic 0). Accordingly, after supply of the system voltage VDD is restored back to the latch circuit 310, logic 1 of the first non-volatile memory device 130 and logic 0 of the second non-volatile memory device 330 may be restored back to the latch circuit 310.

Figure 3G:
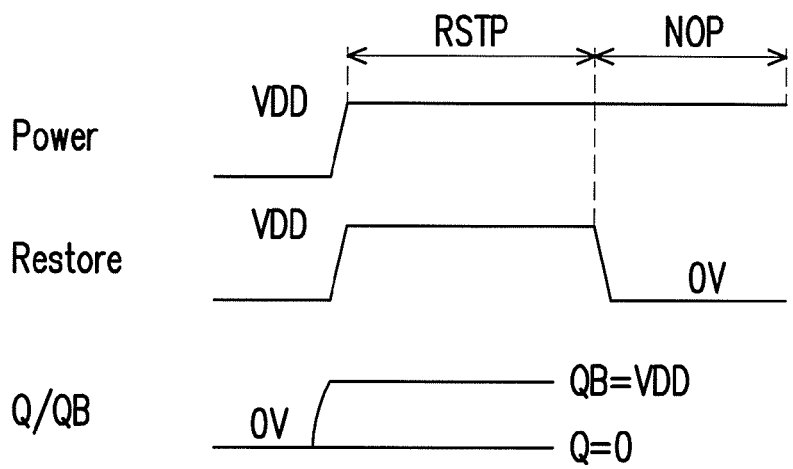
FIG. 3G is a schematic diagram illustrating a timing sequence of the control signal depicted in FIG. 3A according to another embodiment of the present disclosure.

FIG. 3G is a schematic diagram illustrating a timing sequence of the control signal depicted in FIG. 3A according to another embodiment of the present disclosure. Assuming that the resistance state of the first non-volatile memory device 130 is the low resistance state LRS (the low resistance state LRS is considered as logic 0 in this example) and the resistance state of the second non-volatile memory device 330 is the high resistance state HRS (the high resistance state HRS is considered as logic 1 in this example), a voltage difference is present between the voltage of first output terminal Q and the voltage of second output terminal QB (the voltage of second output terminal QB is higher than the voltage of first output terminal Q). Such voltage difference will be pulled up by the latch circuit 310, such that the first output terminal Q of the latch circuit 310 is pulled down to low potential (logic 0) and the second output terminal QB of the latch circuit 310 is pulled up to high potential (logic 1). Accordingly, after supply of the system voltage VDD is restored back to the latch circuit 310, logic 0 of the first non-volatile memory device 130 and logic 1 of the second non-volatile memory device 330 may be restored back to the latch circuit 310.

Figure 4A:
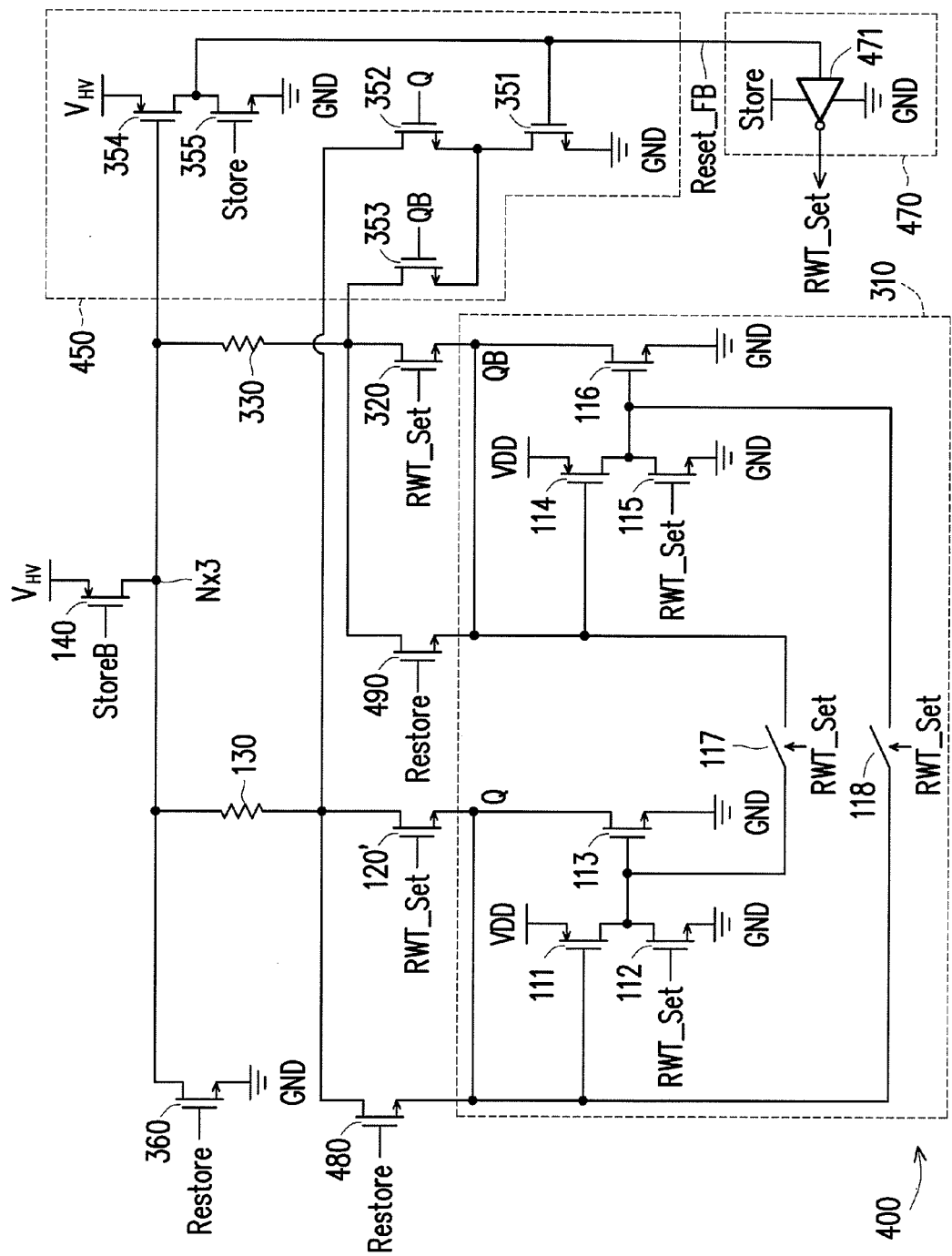
FIG. 4A is a block diagram illustrating circuitry of a non-volatile latch according to yet another embodiment of the invention.

FIG. 4A is a block diagram illustrating circuitry of a non-volatile latch 400 according to yet another embodiment of the invention. The non-volatile latch 400 includes a latch circuit 310, a first switch circuit 120', a first non-volatile memory device 130, a second switch circuit 140 and a third switch circuit 450. The latch circuit 310, the first switch circuit 120', the first non-volatile memory device 130, the second switch circuit 140 and the third switch circuit 450 depicted in FIG. 4A may refer to related description for the latch circuit 110, the first switch circuit 120, the first non-volatile memory device 130, the second switch circuit 140 and the third switch circuit 150 depicted in FIG. 1A and FIG. 2. A latch circuit 310, a first switch circuit 120', a first non-volatile memory device 130, a second switch circuit 140, a third switch circuit 450, a fourth switch circuit 320, a second non-volatile memory device 330 and a transistor 360 depicted in FIG. 4A may refer to related description for the latch circuit 310, the first switch circuit 120', the first non-volatile memory device 130, the second switch circuit 140, the third switch circuit 350, the fourth switch circuit 320, the second non-volatile memory device 330 and the first transistor 360 depicted in FIG. 3A, which is not repeated hereinafter.

In the embodiment depicted in FIG. 4A, the third switch circuit 450 includes a transistor 351, a transistor 352, a transistor 353, a transistor 354 and a transistor 355. Unlike the embodiment depicted in FIG. 3A, the transistor 355 is controlled by a store control signal Store in the embodiment depicted in FIG. 4A. The transistor 355 is turned off in a normal operation period NOP and a restore period RSTP. The transistor 355 is turned on in a store period STP.

In the embodiment depicted in FIG. 4A, the non-volatile latch 400 further includes a self-set control circuit 470, a transistor 480 and a transistor 490. An input terminal of the self-set control circuit 470 is coupled to a second terminal of the transistor 354. An output terminal of the self-set control circuit 470 controls the first switch circuit 120', the fourth switch circuit 320 and the latch circuit 310. When the store control signal Store is in an enable state (e.g., a high voltage level), according to a signal Reset_FB of the second terminal of the transistor 354, the self-set control circuit 470 can correspondingly generate a store control signal RWT_Set for the first switch circuit 120', the fourth switch circuit 320 and the latch circuit 310. For instance, when the store control signal Store is in the enable state (e.g., the high voltage level), the store control signal RWT_Set may be an inversion signal of the signal Reset_FB. When the store control signal Store is in a disable state (e.g., a low voltage level), the store control signal RWT_Set outputted by the self-set control circuit 470 may be maintained at logic 0 (e.g., the low voltage level) and irrelevant to the signal Reset_FB of the second terminal of the transistor 354.

In some embodiments, the self-set control circuit 470 may include a NOT gate 471, but the invention is not limited thereto. An input terminal of the NOT gate 471 is coupled to the second terminal of the transistor 354 to receive the signal Reset_FB. An output terminal of the NOT gate 471 provides the store control signal RWT_Set to the first switch circuit 120', the fourth switch circuit 320 and the latch circuit 310. A power terminal of the NOT gate 471 receives the store control signal Store. A reference voltage terminal of the NOT gate 471 receives the ground voltage GND.

A first terminal of the transistor 480 is coupled to the first output terminal Q of the latch circuit 310. A second terminal of the transistor 480 is coupled to the first terminal of the first non-volatile memory device 130. A first terminal of the transistor 490 is coupled to the second output terminal QB of the latch circuit 310. A second terminal of the transistor 490 is coupled to the first terminal of the second non-volatile memory device 330. The transistor 480 and the transistor 490 are controlled by a restore control signal Restore. The transistor 480 and the transistor 490 are turned on in the restore period RSTP. The transistor 480 and the transistor 490 are turned off in the normal operation period NOP and the store period STP.

TABLE 3

Truth table in the non-volatile latch 400 depicted in FIG. 4A

| | | STP | | |
|---|---|---|---|---|
| Signal | NOP | Reset | Set | RSTP |
| StoreB | $V_{HV}$ | 0 | 0 | $V_{HV}$ |
| Store | 0 | 1 | 1 | 0 |
| Restore | 0 | 0 | 0 | VDD |

Table 3 illustrates the truth table of the store control signal StoreB, the store control signal Store and the restore control signal Restore in the non-volatile latch 400 depicted in FIG. 4A. The programming voltage $V_{HV}$ depicted in FIG. 3A and FIG. 4A may be any voltage level designed to be greater than that of the set voltage VSET depicted in FIG. 2 according to design requirements. In the normal operation period NOP, the store control signal Store is logic 0, a voltage level of the store control signal StoreB is $V_{HV}$, and a voltage level of the restore control signal Restore is logic 0. Accordingly, the control signal RWT_Set outputted by the self-set control circuit 470 is logic 0, the first switch circuit 120', the second switch circuit 140 and the fourth switch circuit 320 are turned off, the transistors 112, 115, 355, 360, 480 and 490 are turned off, and the first switch 117 and the second switch 118 are turned on. Accordingly, the transistor 111, the transistor 113, the transistor 114 and the transistor 116 of the latch circuit 310 form one latch.

Figure 4B:
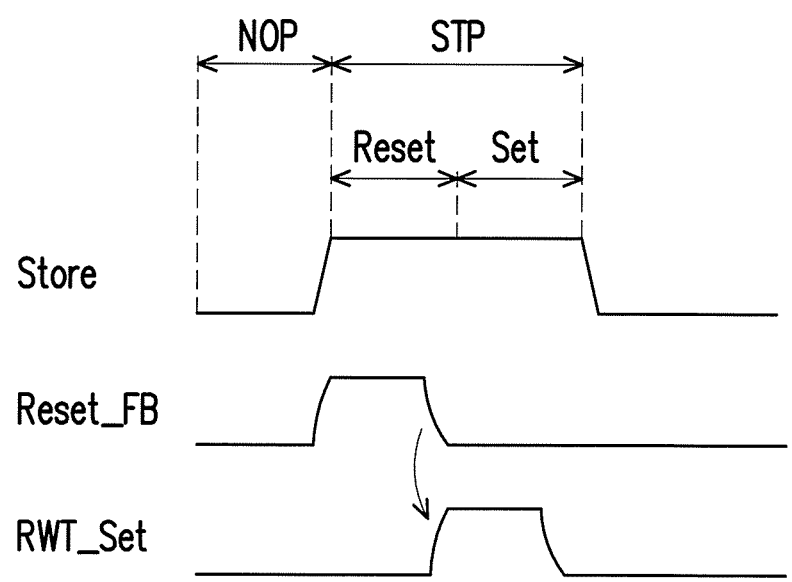
FIG. 4B is a schematic diagram illustrating a timing sequence of the control signal depicted in FIG. 4A according to an embodiment of the present disclosure.

FIG. 4B is a schematic diagram illustrating a timing sequence of the control signal depicted in FIG. 4A according to an embodiment of the present disclosure. In the store period STP, the non-volatile latch 400 can perform the reset stage Reset and the set stage Set in order to store the latched data of the latch circuit 310 (i.e., the output data of the output terminals Q and QB) into the first non-volatile latch 130 and the second non-volatile memory device 330. In the reset stage Reset, the store control signal StoreB and the restore control signal Restore are both logic 0, and the store control signal Store is logic 1 (the high voltage level, such as the system voltage VDD or the programming voltage $V_{HV}$). Accordingly, the second switch circuit 140 is turned on, the transistor 355 is turned on, the self-set control circuit 470 is enabled, and the transistors 360, 480 and 490 are turned off. At the beginning of the reset stage Reset, because the control signal RWT_Set outputted by the self-set control circuit 470 is logic 0, the first switch circuit 120' and the fourth switch circuit 320 are turned off, the transistors 112 and 115 are turned off, and the first switch 117 and the second switch 118 are turned on.

Assuming that the output data of the first output terminal Q of the latch circuit 310 is logic 1 (i.e., the output data of the second output terminal QB is logic 0), the transistor 352 is turned on, and the transistor 353 is turned off. The first terminal of the first non-volatile memory device 130 is coupled to the ground voltage GND via the transistors 352 and 351. Accordingly, the first non-volatile memory device 130 starts the "reset" operation in the reset stage Reset of the store period STP if the resistance state of the first non-volatile memory device 130 is the low resistance state LRS and the second non-volatile memory device 330 is the high resistance state HRS in the normal operation period NOP, so that the resistance state of the first non-volatile memory device 130 is transformed from the low resistance state LRS into the high resistance state HRS. When the resistance state of the first non-volatile memory device 130 is transformed from the low resistance state LRS into the high resistance state HRS, the gate voltage of the transistor 354 is transformed from low potential into high potential so that the transistor 351 is turned off to disconnect the first terminal of the first non-volatile memory device 130 from the ground voltage GND. Accordingly, in the reset stage Reset, the non-volatile latch 400 may store logic 1 of the first output terminal Q of the latch circuit 310 into the first non-volatile memory device 130 (the high resistance state HRS is considered as logic 1 in this example). When the resistance state of the first non-volatile memory device 130 is transformed into the high resistance state HRS, the third switch circuit 450 can dynamically disconnect the first terminal of the first non-volatile memory device 130 from the ground voltage GND, so as to reduce power consumption. In other words, the non-volatile latch 400 can self-terminate the "reset" operation.

Assuming that the output data of the first output terminal Q of the latch circuit 310 is logic 1 (i.e., the output data of the second output terminal QB is logic 0), but the resistance state of the first non-volatile memory device 130 is the high resistance state HRS when the reset stage Reset begins. The voltage of the node Nx3 is high potential because the resistance state of the first non-volatile memory device 130 is the high resistance state HRS, so that the transistor 354 is turned off in the reset stage Reset of the store period STP. The signal Reset_FB is pulled down by the transistor 355, so that the transistor 351 is turned off in the reset stage Reset of the store period STP. Accordingly, no operation happening on the first non-volatile memory device 130 (the high resistance state HRS is considered as logic 1 in this example). When the transistor 351 is turned off, the third switch circuit 450 can dynamically disconnect the first terminal of the first non-volatile memory device 130 from the ground voltage GND, so as to reduce power consumption.

Based on above examples, when the resistance state of the first non-volatile memory device 130 is transformed from the low resistance state LRS into the high resistance state HRS, the gate voltage of the transistor 354 is transformed from low potential into high potential, so as to transform the signal Reset_FB from high potential (logic 1) into low potential (logic 0). Accordingly, the store control signal RWT_Set is transformed from the low potential (logic 0) into high potential (logic 1), such that the reset stage Reset is self-terminated and the set stage Set is automatically entered. In the set stage Set of the store period STP, the store control signal Store and the store control signal RWT_Set are logic 1, and the store control signal StoreB and the restore control signal Restore are both logic 0. Accordingly, the first switch circuit 120', the second switch circuit 140 and the fourth switch circuit 320 are turned on, the transistors 112 and 115 are turned on, the first switch 117 and the second switch 118 are turned off, the transistors 360, 480 and 490 are turned off, and the transistor 355 is turned on.

Assuming that the output data of the first output terminal Q of the latch circuit 310 is logic 1 (i.e., the output data of the second output terminal QB is logic 0), the resistance state of the first non-volatile memory device 130 does not change. The first terminal of the second non-volatile memory device 330 is coupled to the ground voltage GND via the fourth switch circuit 320 and the transistor 116. Accordingly, the second non-volatile memory device 330 starts the "set" operation in the set stage Set of the store period STP if the resistance state of the first non-volatile memory device 130 is the low resistance state LRS and the second non-volatile memory device 330 is the high resistance state HRS in the normal operation period NOP (the resistance state of the first non-volatile memory device 130 has be reset to the high resistance state HRS in the reset stage Reset of the store period STP), so that the resistance state of the second non-volatile memory device 330 is transformed from the high resistance state HRS into the low resistance state LRS. When the resistance state of the second non-volatile memory device 330 is transformed from the high resistance state HRS into the low resistance state LRS, potential of QB is transformed from low potential (logic 0) into high potential (logic 1). The transformation in potential of QB transforms the gate voltage of the transistor 116 from high potential (logic 1) into low potential (logic 0), so that the transistor 116 is turned off to disconnect the first terminal of the second non-volatile memory device 330 from the ground voltage GND. Accordingly, in the set stage Set, the non-volatile latch 400 may store the latched data of the latch circuit 310 into the second non-volatile memory device 330 (the low resistance state LRS is considered as logic 0 in this example). When the resistance state of the second non-volatile memory device 330 is transformed into the low resistance state LRS, the transistor 116 can dynamically disconnect the first terminal of the second non-volatile memory device 330 from the ground voltage GND, so as to reduce power consumption. In other words, the non-volatile latch 400 can self-terminate the "set" operation.

Assuming that the output data of the first output terminal Q of the latch circuit 310 is logic 1 (i.e., the output data of the second output terminal QB is logic 0), but the resistance state of the second non-volatile memory device 330 is the low resistance state LRS when the set stage Set begins. The voltage of the second output terminal QB is pulled up by the second non-volatile memory device 330 and transistor 140 in the set stage Set of the store period STP because the resistance state of the second non-volatile memory device 330 is the low resistance state LRS. The transistor 114 is turned off, and the transistor 116 is turned off to disconnect the first terminal of the second non-volatile memory device 330 from the ground voltage GND in the set stage Set of the store period STP. Accordingly, no operation happening on the second non-volatile memory device 330 (the low resistance state LRS is considered as logic 0 in this example). When the transistor 116 is turned off, the transistor 116 can dynamically disconnect the first terminal of the second non-volatile memory device 330 from the ground voltage GND, so as to reduce power consumption.

After the store period STP is completed, the power (the system voltage VDD) of the non-volatile latch 400 may be turned off, while the original data of the latch circuit 310 is kept by the first non-volatile memory device 130 and the second non-volatile memory device 330.

After the power is restored (supply of the system voltage VDD is restored) back to the latch circuit 310, the non-volatile latch 400 first enters the restore period RSTP. In the restore period RSTP, the voltage level of the store control signal StoreB is the programming voltage $V_{HV}$, the store control signal Store is logic 0, and the voltage level of the store control signal Restore is the system voltage VDD. Accordingly, the second switch circuit 140 and the transistor 355 are turned off, the transistors 360, 480 and 490 are turned on, the control signal RWT_Set outputted by the self-set control circuit 470 is logic 0, the first switch circuit 120' and the fourth switch circuit 320 are turned off, the transistors 112 and 115 are turned off, and the first switch 117 and the second switch 118 are turned on. Assuming that the resistance state of the first non-volatile memory device 130 is the high resistance state HRS (the high resistance state HRS is considered as logic 1 in this example) and the resistance state of the second non-volatile memory device 330 is the low resistance state LRS (the low resistance state LRS is considered as logic 0 in this example), a voltage difference is present between the voltage of Q and the voltage of QB (the voltage of QB is lower than the voltage of Q). Such voltage difference will be pulled up by the latch circuit 310, such that the first output terminal Q of the latch circuit 310 is pulled up to high potential (logic 1) and the second output terminal QB of the latch circuit 310 is pulled down to low potential (logic 0). Accordingly, after supply of the system voltage VDD is restored back to the latch circuit 310, logic 1 of the first non-volatile memory device 130 and logic 0 of the second non-volatile memory device 330 may be restored back to the latch circuit 310.

It should be noted that, in different application scenarios, related functions of the non-volatile latch 100, the non-volatile latch 300, the non-volatile latch 400, the latch circuit 110, the latch circuit 310, the first switch circuit 120, the first switch circuit 120', the first non-volatile memory device 130, the second switch circuit 140, the third switch circuit 150, the third switch circuit 350 and/or the third switch circuit 350' can be implemented as firmware or hardware by utilizing hardware description languages (e.g., Verilog HDL or VHDL) or other suitable programming languages. The firmware capable of executing the related functions can be arranged into any known computer-accessible media such as magnetic tapes, semiconductor memories, magnetic disks or compact disks (e.g., CD-ROM or DVD-ROM); or the firmware may be transmitted via the Internet, a wired communication, a wireless communication or other communication mediums. Said firmware can be stored in the computer-accessible media, so that a computer processor can access/execute programming codes of the firmware. In addition, the device and the method of the invention can also be implemented by a combination of software and hardware.

In summary, the non-volatile latches 100, 300 or 400 provided in the foregoing embodiments can include characteristics of common latches in the normal operation period NOP. In the store period STP before turning off the power of the latch, the non-volatile latches 100, 300 or 400 can store the latched data of the latch circuits 110 or 310 into the non-volatile memory device 130 and/or 330. As a result, after turning off the power of the non-volatile latches 100, 300 or 400, the non-volatile latches 100, 300 or 400 can keep the original data.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A non-volatile latch, comprising:
   a latch circuit, having a first output terminal;
   a first switch circuit, having a first terminal coupled to the first output terminal of the latch circuit, wherein the first switch circuit is turned off in a normal operation period;
   a first non-volatile memory device, having a first terminal coupled to a second terminal of the first switch circuit;
   a second switch circuit, having a first terminal coupled to a second terminal of the first non-volatile memory device, and a second terminal coupled to a programming voltage; and
   a third switch circuit, having a first terminal coupled to the first terminal of the first non-volatile memory device, wherein in a store period, the third switch circuit dynamically determines whether to couple the first terminal of the first non-volatile memory device to a reference voltage according to latched data of the latch circuit and a state transformation condition of the first non-volatile memory device.

2. The non-volatile latch of claim 1, wherein the first non-volatile memory device comprises a resistive memory.

3. The non-volatile latch of claim 1, wherein the second switch circuit comprises:
   a transistor, having a first terminal coupled to the programming voltage, and a second terminal coupled to the second terminal of the first non-volatile memory device.

4. The non-volatile latch of claim 1, wherein the latch circuit comprises:

a first transistor, having a first terminal coupled to a system voltage, and a control terminal coupled to the first output terminal of the latch circuit;

a second transistor, having a first terminal coupled to the reference voltage, and a second terminal coupled to a second terminal of the first transistor;

a third transistor, having a first terminal coupled to the reference voltage, a second terminal coupled to the first output terminal of the latch circuit, and a control terminal coupled to the second terminal of the first transistor;

a fourth transistor, having a first terminal coupled to the system voltage, and a control terminal coupled to a second output terminal of the latch circuit;

a fifth transistor, having a first terminal coupled to the reference voltage, and a second terminal coupled to a second terminal of the fourth transistor;

a sixth transistor, having a first terminal coupled to the reference voltage, a second terminal coupled to the second output terminal of the latch circuit, and a control terminal coupled to the second terminal of the fourth transistor;

a first switch, having a first terminal coupled to the second terminal of the first transistor, and a second terminal coupled to the control terminal of the fourth transistor and the second terminal of the sixth transistor; and a second switch, having a first terminal coupled to the control terminal of the first transistor and the second terminal of the third transistor, and a second terminal coupled to the second terminal of the fourth transistor;

wherein the second transistor and the fifth transistor are turned off when the first switch and the second switch are turned on, and the second transistor and the fifth transistor are turned on when the first switch and the second switch are turned off.

5. The non-volatile latch of claim 4, wherein the first switch circuit comprises:

a first switching transistor, having a first terminal coupled to the first output terminal of the latch circuit, wherein the first switching transistor is turned on in the store period, and the first switching transistor is turned off in the normal operation period; and a second switching transistor, having a first terminal coupled to a second terminal of the first switching transistor, a second terminal coupled to the first terminal of the first non-volatile memory device, and a control terminal coupled to the second output terminal of the latch circuit.

6. The non-volatile latch of claim 4, wherein the third switch circuit comprises:

a seventh transistor, having a first terminal coupled to the reference voltage, wherein the seventh transistor is turned on in the store period, and the seventh transistor is turned off in the normal operation period;

an eighth transistor, having a first terminal coupled to a second terminal of the seventh transistor, a second terminal coupled to the first terminal of the first non-volatile memory device, and a control terminal coupled to the second terminal of the fourth transistor; and a ninth transistor, having a first terminal coupled to a store control signal, a second terminal coupled to the second output terminal of the latch circuit, and a control terminal coupled to the first terminal of the first non-volatile memory device.

7. The non-volatile latch of claim 4, further comprising:

a first controlling transistor, having a first terminal coupled to the reference voltage, and a second terminal coupled to the first terminal of the first non-volatile memory device, wherein the first controlling transistor is turned on in a restore period, and the first controlling transistor is turned off in the normal operation period and the store period; and a second controlling transistor, having a first terminal coupled to the first output terminal of the latch circuit, and a second terminal coupled to the second terminal of the first non-volatile memory device, wherein the second controlling transistor is turned on in the store period and the restore period, and the second controlling transistor is turned off in the normal operation period.

8. The non-volatile latch of claim 1, further comprising:

a fourth switch circuit, having a first terminal coupled to a second output terminal of the latch circuit, wherein the fourth switch circuit is turned off in the normal operation period; and a second non-volatile memory device, having a first terminal coupled to a second terminal of the fourth switch circuit, and a second terminal coupled to the first terminal of the second switch circuit;

wherein a second terminal of the third switch circuit is coupled to the first terminal of the second non-volatile memory device, wherein in the store period, the third switch circuit dynamically determines whether to couple the first terminal of the first non-volatile memory device to the reference voltage according to the latched data of the latch circuit and the state transformation condition of the first non-volatile memory device, or dynamically determines whether to couple the first terminal of the second non-volatile memory device to the reference voltage according to the latched data of the latch circuit and a state transformation condition of the second non-volatile memory device.

9. The non-volatile latch of claim 8, wherein the second non-volatile memory device comprises a resistive memory.

10. The non-volatile latch of claim 8, wherein the first switch circuit and the fourth switch circuit are turned off in a reset stage of the store period, and the first switch circuit and the fourth switch circuit are turned on in a set stage of the store period and a restore period.

11. The non-volatile latch of claim 8, wherein the third switch circuit comprises:

a first transistor, having a first terminal coupled to the reference voltage;

a second transistor, having a first terminal coupled to a second terminal of the first transistor, a second terminal coupled to the first terminal of the first non-volatile memory device, and a control terminal coupled to the first output terminal of the latch circuit;

a third transistor, having a first terminal coupled to the second terminal of the first transistor, a second terminal coupled to the first terminal of the second non-volatile memory device, and a control terminal coupled to the second output terminal of the latch circuit;

a fourth transistor, having a first terminal coupled to the programming voltage, a second terminal coupled to a control terminal of the first transistor, and a control terminal coupled to the second terminal of the first non-volatile memory device and the second terminal of the second non-volatile memory device; and a fifth transistor, having a first terminal coupled to the reference voltage, and a second terminal coupled to the second terminal of the fourth transistor.

12. The non-volatile latch of claim 11, further comprising:
a self-set control circuit, having an input terminal coupled to the second terminal of the fourth transistor, and an output terminal controlling the first switch circuit, the fourth switch circuit and the latch circuit.

13. The non-volatile latch of claim 8, further comprising:
a first transistor, having a first terminal coupled to the reference voltage, and a second terminal coupled to the second terminal of the first non-volatile memory device and the second terminal of the second non-volatile memory device, wherein the first transistor is turned on in a restore period, and the first transistor is turned off in the store period.

14. The non-volatile latch of claim 8, further comprising:
a first transistor, having a first terminal coupled to the first output terminal of the latch circuit, and a second terminal coupled to the first terminal of the first non-volatile memory device, wherein the first transistor is turned on in a restore period, and the first transistor is turned off in the store period; and
a second transistor, having a first terminal coupled to the second output terminal of the latch circuit, and a second terminal coupled to the first terminal of the second non-volatile memory device, wherein the second transistor is turned on in the restore period, and the second transistor is turned off in the store period.

* * * * *